United States Patent
Lim et al.

(10) Patent No.: US 8,575,705 B2
(45) Date of Patent: Nov. 5, 2013

(54) SEMICONDUCTOR DEVICES INCLUDING MOS TRANSISTORS HAVING AN OPTIMIZED CHANNEL REGION AND METHODS OF FABRICATING THE SAME

(75) Inventors: Hajin Lim, Seoul (KR); Myungsun Kim, Hwaseong-si (KR); Hoi Sung Chung, Hwaseong-si (KR); Jinho Do, Hwaseong-si (KR); Weonhong Kim, Suwon-si (KR); Moonkyun Song, Anyang-si (KR); Dae-Kwon Joo, Osan-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 361 days.

(21) Appl. No.: 12/964,173

(22) Filed: Dec. 9, 2010

(65) Prior Publication Data
US 2011/0175141 A1    Jul. 21, 2011

(30) Foreign Application Priority Data
Jan. 18, 2010    (KR) .......................... 10-2010-0004447

(51) Int. Cl.
*H01L 21/70* (2006.01)

(52) U.S. Cl.
USPC ................... 257/369; 257/192; 257/E21.632; 257/E21.131; 438/701

(58) Field of Classification Search
USPC .................. 257/369, 392, E21.632, E21.635, 257/E21.637, E21.638, E21.639, E21.64, 257/64, 192, E21.131; 438/503, 507, 153, 438/154, 199, 163
See application file for complete search history.

(56) References Cited

U.S. PATENT DOCUMENTS

| | | | |
|---|---|---|---|
| 6,407,005 B2 * | 6/2002 | Weon | 438/756 |
| 7,220,626 B2 | 5/2007 | Zhu et al. | |
| 2005/0260820 A1 * | 11/2005 | Kanamitsu et al. | 438/312 |
| 2008/0079086 A1 | 4/2008 | Jung et al. | |
| 2009/0095981 A1 | 4/2009 | Kang et al. | |
| 2009/0146263 A1 | 6/2009 | Chen et al. | |

FOREIGN PATENT DOCUMENTS

| | | |
|---|---|---|
| JP | 2009-099956 A | 5/2009 |
| KR | 10 2008-0014307 A | 2/2008 |
| KR | 10 2009-0038653 A | 4/2009 |

OTHER PUBLICATIONS

Inoue, et al., Impact of Area Scaling on Threshold Voltage Lowering in La-Containing High-k/Metal Gate NMOSFETs Fabricated on (100) and (110)Si; 2009 Symposium on VLSI Technology Digest of Technical Papers; 2009; 3A-4; Renesas Technology Corporation and Panasonic Corporation; Japan.

* cited by examiner

*Primary Examiner* — Fernando L Toledo
*Assistant Examiner* — Sonya D McCall Shepard
(74) *Attorney, Agent, or Firm* — Lee & Morse, P.C.

(57) ABSTRACT

A semiconductor device, including a device isolation layer arranged on a predetermined region of a semiconductor substrate to define an active region, the active region including a central top surface of a (100) crystal plane and an inclined edge surface extending from the central top surface to the device isolation layer, a semiconductor pattern covering the central top surface and the inclined edge surface of the active region, the semiconductor pattern including a flat top surface of a (100) crystal plane that is parallel with the central top surface of the active region and a sidewall that is substantially perpendicular to the flat top surface, and a gate pattern overlapping the semiconductor pattern.

20 Claims, 6 Drawing Sheets

SEMICONDUCTOR DEVICES INCLUDING MOS TRANSISTORS HAVING AN OPTIMIZED CHANNEL REGION AND METHODS OF FABRICATING THE SAME

BACKGROUND

1. Field

Embodiments relate to semiconductor devices and methods of fabricating the same, and more particularly, to semiconductor devices including MOS transistors including an optimized channel region and methods of fabricating the same.

2. Description of the Related Art

MOS transistors are widely used in the semiconductor devices as active devices such as switching devices. Specially, CMOS integrated circuits including NMOS transistors and PMOS transistors are widely used for improving standby current characteristic, which is one of electrical characteristic of semiconductor devices.

In general, CMOS circuits may include MOS transistors having a variety of channel widths. For example, the NMOS transistors and the PMOS transistors may have narrow channel widths that are equal to minimum feature size relevant to the resolution limit of photolithography process.

Meanwhile, to improve operating characteristics of a CMOS circuit, the NMOS and PMOS transistors may be improved in regard to current drivability. The current drivability can be improved by reducing threshold voltages of the MOS transistors. Recently, a technology to interpose a layer containing lanthanum between a gate electrode and a channel region is used in order to reduce the threshold voltages of the NMOS transistors. However, in case that a layer containing lanthanum is formed in NMOS transistors having narrow channel width, the threshold voltage of NMOS transistors having narrow channel width may be higher than that of NMOS transistors having relatively wide channel width. Thus, there are limitations to improving electric characteristics of the semiconductor device that includes NMOS transistors with narrow channel width.

SUMMARY

Embodiments are therefore directed to semiconductor devices and methods of fabricating the same, which substantially overcome one or more of the problems due to the limitations and disadvantages of the related art.

It is therefore a feature of an embodiment to provide semiconductor devices including MOS transistors that include an optimized channel region as compared to comparable conventional devices and methods of fabricating the same.

It is therefore another feature of an embodiment to provide semiconductor devices that may effectively improve narrow channel width effect in the MOS transistors, as compared to comparable conventional devices.

It is therefore a separate feature of an embodiment to provide a method of fabricating a semiconductor device that is capable of improving narrow channel width effect in the MOS transistors, as compared to comparable conventional devices.

At least one of the above and other features and advantages may be realized by providing a semiconductor device, including a device isolation layer arranged on a predetermined region of a semiconductor substrate to define an active region, the active region including a central top surface of a (100) crystal plane and an inclined edge surface extending from the central top surface to the device isolation layer, a semiconductor pattern covering the central top surface and the inclined edge surface of the active region, the semiconductor pattern including a flat top surface of a (100) crystal plane that is parallel with the central top surface of the active region and a sidewall that is substantially perpendicular to the flat top surface, and a gate pattern overlapping the semiconductor pattern.

The semiconductor substrate may include a main surface of a (100) crystal plane.

A contact portion of the central top surface and the inclined edge surface may be at a higher level than a contact portion of the inclined edge surface and the device isolation layer.

The inclined edge surface may include a (110) crystal plane.

The inclined edge surface may include a rounded profile shape.

The sidewall of the semiconductor pattern may include a (100) crystal plane.

The gate pattern may include a gate insulating layer and a gate electrode that are sequentially stacked.

The gate insulating layer may include lanthanum.

The active region, the gate pattern, and the semiconductor pattern correspond to a first active region, a first gate pattern, and a first semiconductor pattern, respectively, and the semiconductor device further includes a second active region adjacent to the first active region, the second active region defined by the device isolation layer, a second semiconductor pattern including a lower semiconductor pattern and an upper semiconductor pattern that are sequentially stacked on the second active region, wherein the lower semiconductor pattern and the upper semiconductor pattern may have different band gap energies and a second gate pattern overlapping the upper semiconductor pattern.

One of the lower semiconductor pattern and the upper semiconductor pattern may include a silicon pattern that is the same as a silicon pattern of the first semiconductor pattern, and the other of the lower semiconductor pattern and the upper semiconductor pattern includes a silicon-germanium pattern.

At least one of the above and other features and advantages may be realized by providing a method for fabricating a semiconductor device, including forming a device isolation layer on a predetermined region of a semiconductor substrate to define an active region, wherein the active region includes a central top surface of a (100) crystal plane and an inclined edge surface extending from the central top surface to the device isolation layer, forming a semiconductor pattern on the central top surface and the inclined edge surface of the active region, wherein the semiconductor pattern includes a flat top surface of a (100) crystal plane that is parallel with the central top surface of the active region and a sidewall which is substantially perpendicular to the flat top surface, and forming a gate pattern overlapping the semiconductor pattern.

The inclined edge surface may include a (110) crystal plane.

Forming the semiconductor pattern may include performing a selective epitaxial growth technology so as to include a (100) crystal plane.

The gate pattern may include a gate insulating layer and a gate electrode that are sequentially stacked.

The gate insulating layer may include lanthanum.

A method of fabricating a semiconductor device, including forming a device isolation layer on a predetermined region of the semiconductor substrate to define a first active region and a second active region, wherein at least the first active region out of the first and second active regions includes a central top surface of a (100) crystal plane and an inclined edge surface extending from the central top surface to the device isolation layer, faulting a first semiconductor pattern and a second semiconductor pattern respectively on the first and the second active regions, wherein the first semiconductor pattern includes a flat top surface of (100) crystal plane which is parallel with the central top surface of the first active region and a sidewall which is substantially perpendicular to the flat top surface of the first active region, and the second semiconductor pattern includes a lower semiconductor pattern having a first band gap energy and an upper semiconductor pattern having a second band gap energy that is different from the first band gap energy, and forming a first gate pattern and a second gate pattern overlapping the first and the second semiconductor patterns, respectively.

The inclined edge surface may include a (110) crystal plane.

The sidewall of the first semiconductor pattern may be formed by a selective epitaxial growth technology to include a (100) crystal plane.

Forming the first and second semiconductor patterns may include selectively forming a first silicon pattern and a second silicon pattern on the first active region and the second active region, respectively, forming a mask pattern covering the first silicon pattern, selectively forming a silicon-germanium pattern on the second active region, and removing the mask pattern.

Forming the first and second semiconductor patterns may include forming a mask pattern covering the first active region, selectively forming a silicon-germanium pattern on the second active region, removing the mask pattern, and forming a first silicon pattern and a second silicon pattern on the first active region and the silicon-germanium pattern, respectively.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
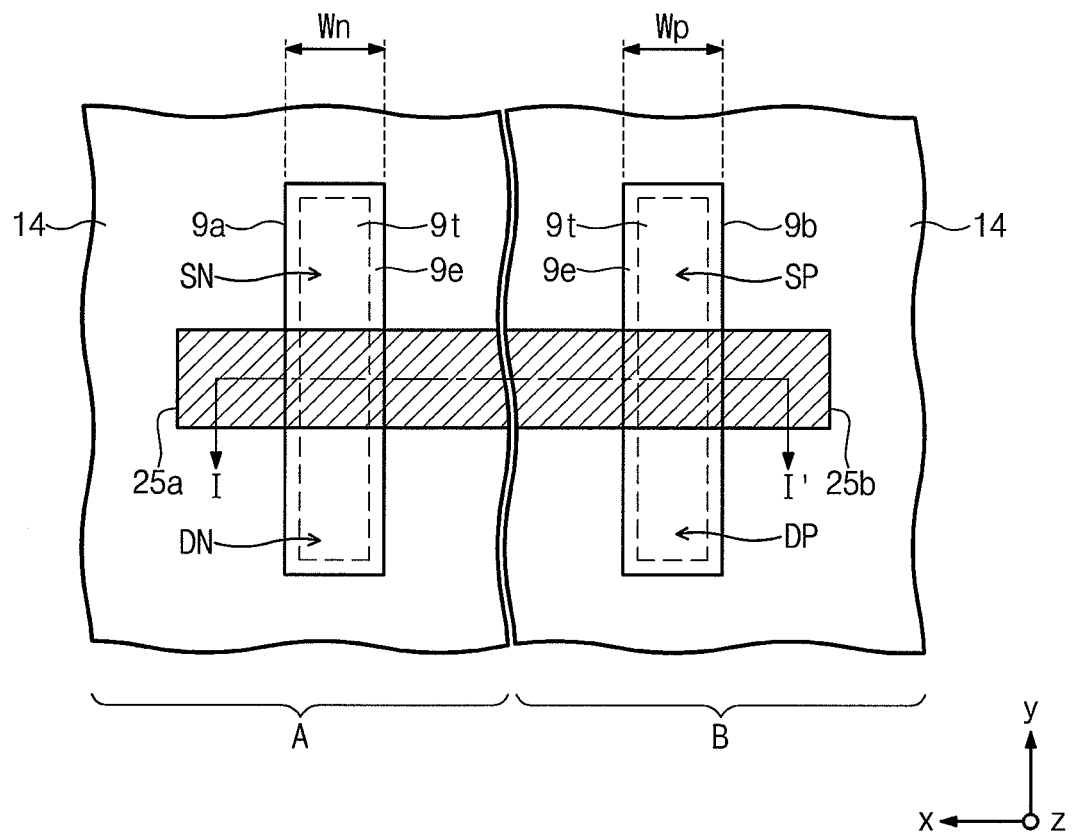
FIG. 1 illustrates a plan view of a portion of a semiconductor device employing one or more aspects of the inventive concept.

Korean Patent Application No. 10-2010-0004447, filed on Jan. 18, 2010, in the Korean Intellectual Property Office, and entitled: "Semiconductor Devices Including MOS Transistors Having an Optimized Channel Region and Methods of Fabricating the Same," is incorporated by reference herein in its entirety.

Exemplary embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when an element is referred to as being "on," "above", "below," or "under" another element, it can be directly "on," "above", "below," or "under" the other element, respectively, or intervening elements may also be present. In addition, it will also be understood that when an element is referred to as being "between" two elements, it can be the only element between the two elements, or one or more intervening elements may also be present.

It will be also be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. Like reference numerals refer to like elements throughout the specification.

Figure 2A:
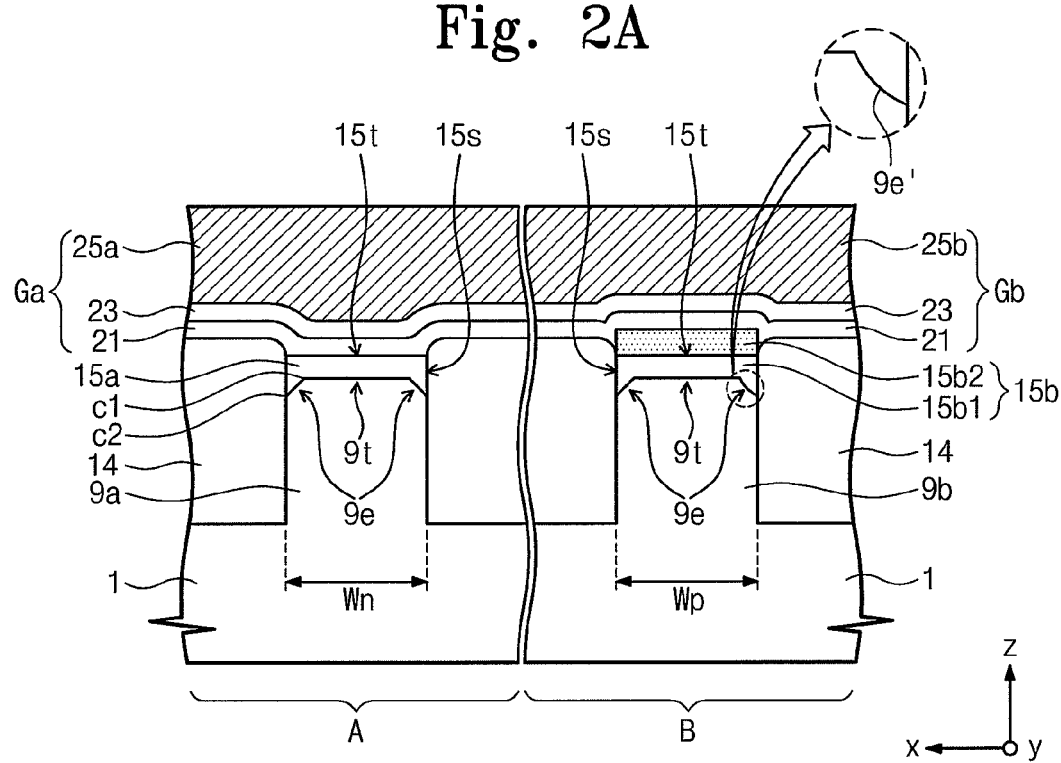
FIG. 2A illustrates a cross-sectional view of an exemplary embodiment of the semiconductor device of FIG. 1, taken along line I-I' of FIG. 1.

FIG. 1 illustrates a plan view of a portion of a semiconductor device employing one or more aspects of the inventive concept. FIG. 2A illustrates a cross-sectional view of an exemplary embodiment of the semiconductor device of FIG. 1, taken along line I-I' of FIG. 1.

Referring to FIGS. 1 and 2A, a semiconductor substrate 1 including a first region A and a second region B is provided. The semiconductor substrate 1 may be a mono crystalline silicon substrate that includes a main surface of a (100) crystal plane. The first region A may be a NMOS region, and the second region B may be a PMOS region.

A device isolation layer 14 may be disposed on a predetermined region of the semiconductor substrate 1. The device isolation layer 14 may define a plurality of active regions. For example, the device isolation layer 14 may define a first active region 9a and a second active region 9b in the first region A and the second region B, respectively. The first and second active regions 9a and 9b may have a first width Wn and a second width Wp, respectively.

While not shown in FIG. 2A, in embodiments, a first well may be provided in the semiconductor substrate 1 of the first region A, and a second well may be provided in the semiconductor substrate 1 of the second region B. More particularly, e.g., in the exemplary embodiment of FIG. 2A, the first well and the second well may be P-type well and N-type well, respectively.

One, some, or all of the active regions, e.g., the first active region 9a and/or the second active region 9a and 9b, may include a central top surface 9t of a (100) crystal surface and an inclined edge surface 9e. The inclined edge surface may extend from the central top surface 9t to the device isolation layer 14.

The inclined edge surface 9e may include a positive sloped profile shape. Thus, a contact portion c1 of the central top surface 9t and the inclined edge surface 9e may be a higher level than a contact portion c2 of the inclined edge surface 9e and the isolation layer 14. The inclined edge surface 9e may include a (110) crystal surface.

In the exemplary embodiment illustrated in FIG. 2A, the inclined edge surface 9e has a flat profile shape. However, embodiments are not limited thereto. For example, an inclined edge surface 9e may include a rounded profile shape 9e', as shown in an enlarged window in FIG. 2A.

Referring to FIG. 2A, a top surface of the device isolation layer 14 may be at a higher level along a z-direction than the central top surfaces 9t of the active regions 9a and 9b.

The central top surfaces 9t of one, some, or all of the active regions, e.g., 9a, 9b may be covered with a respective semiconductor pattern, e.g., 15a, 15b. The respective semiconductor patterns, e.g., 15a, 15b, may include a single layer and/or multiple layers. Referring to the exemplary embodiment of FIG. 2a, e.g., the central top surface 9t and the inclined edge surface 9e of the first active region 9a may be covered with a first semiconductor pattern 15a. The central top surface 9t and the inclined edge surface 9e of the second active region 9b may be covered with a second semiconductor pattern 15b. The first semiconductor pattern 15a may include a mono crystalline silicon pattern. The second semiconductor pattern 15b may include a lower semiconductor pattern 15b1 and an upper semiconductor pattern 15b2 that are sequentially stacked on each other.

The lower semiconductor pattern 15b1 may include a same material layer as the first semiconductor pattern 15a. The lower semiconductor pattern 15b1 and the first semiconductor pattern 15a may include, e.g., a single semiconductor pattern such as, e.g., a mono crystalline pattern. For example, in some embodiments, the lower semiconductor pattern 15a and the lower semiconductor pattern 15b1 may include one, some, or all of the same materials. Embodiments are not, however, limited thereto.

The upper semiconductor pattern 15b2 may be a material layer having a band gap energy different from that of the lower semiconductor pattern 15b1. For example, the band gap energy of the upper semiconductor pattern 15b2 may be lower than that of the lower semiconductor pattern 15b1. For example, in an embodiment, the upper semiconductor pattern 15b2 may include a mono crystalline silicon-germanium pattern, while the lower semiconductor pattern 15b1 may include a mono crystalline silicon pattern.

Referring to FIG. 2A, the first semiconductor pattern 15a and/or the lower semiconductor pattern 15b1 may include a flat top surface 15t of a (100) crystal plane and a sidewall 15s. The flat top surface 15t of the respective semiconductor pattern 15a, 15b1 may be parallel with the central top surface 9t of the first active region 9a and the second active region 9b, respectively. For example, the flat top surface 15t of the respective semiconductor pattern 15a, 15b1 may extend along an x-direction. The respective sidewall 15s of the first semiconductor pattern 15a and/or the lower semiconductor pattern 15b1 may be substantially and/or completely perpendicular to the flat top surface 15t. The respective sidewalls 15s may extend, e.g., along the z-direction. The sidewall 15s of the first semiconductor pattern 15a and/or the lower semiconductor pattern 15b1 may include a (100) crystal surface. In embodiments, the top surface 15t and the sidewall 15s of the first semiconductor pattern 15a and/or the lower semiconductor pattern 15b1 may be substantially and/or completely perpendicular to each other and may not include any inclined surfaces, e.g., surface extending along x and z directions. Further, in embodiments, while a top surface of the active regions 9a, 9b may include an inclined surface, e.g., 9e, the top surface 15t of the first semiconductor pattern 15a and/or the lower semiconductor pattern 15b1 may not include any inclined surfaces.

In some embodiments, the top surface of the device isolation layer 14 may be a lower level than the center top surfaces 9t of the active regions 9a and 9b. In such embodiments, the first semiconductor pattern 15a and the lower semiconductor pattern 15b1 may also include flat top surfaces 15t of (100) crystal surface that are parallel with the central top surfaces 9t of the first and second active regions 9a and 9b and sidewalls which are substantially and/or completely perpendicular to the flat top surfaces 15t. Thus, in embodiments, the semiconductor patterns, e.g., 15a and 15b1, may not have any inclined surface of a (110) crystal surface even if the top surface of the device isolation layer 14 is a lower level than the central top surfaces 9t of the active regions 9a and 9b.

A first gate pattern Ga may be disposed to cross over the first semiconductor pattern 15a. A second gate pattern Gb may be disposed to cross over the upper semiconductor pattern 15b2.

The first gate pattern Ga may include a first gate insulating layer (e.g., 21 and 23) and a first gate electrode 25a that are sequentially stacked. The second gate pattern Gb may include a second gate insulating layer (e.g., 21 and 23) and a second gate electrode 25b that are sequentially stacked. That is, e.g., the first gate insulating layer and the second gate insulating layer may include a high-k dielectric layer 21 and a capping layer 23 that are sequentially stacked. In the exemplary embodiment of FIG. 2A, the capping layer 23 is illustrated as being above the high-k dielectric layer 21. However, embodiments are not limited thereto. For example, the capping layer 23 may be disposed under the high-k dielectric layer 21. The capping layer 23 may include a layer including, e.g., lanthanum. More particularly, e.g., the capping layer 23 may be a lanthanum oxide.

Referring to FIG. 1, an N-type source region SN and an N-type drain region DN may be provided in the first active region 9a on respective side portions of the first gate electrode 25a. As the result, the first gate electrode 25a and the N-type source/drain regions SN and DN may form an NMOS transistor. The first width Wn may correspond to a channel width of the NMOS transistor.

Still referring to FIG. 1, a P-type source region SP and a P-type drain region DP may be provided in the second active region 9b on respective side portions of the second gate electrode 25b. Therefore, the second gate electrode 25b, the source region SP, and the drain region DP may form a PMOS transistor. The second width Wp may correspond to a channel width of the PMOS transistor.

The capping layer 23 may include a material, e.g., lanthanum, to reduce threshold voltage variations of the NMOS transistor. More particularly, e.g., the capping layer 23 may include, e.g., lanthanum, to improve current driving ability and switching speed of the NMOS transistor. In such embodiments, the lanthanum atoms in the capping layer 23 of the first region A may be diffused through the high-k dielectric layer 21 to be distributed at an interface between the first semiconductor pattern 15a and the high-k dielectric layer 21. Further, such lanthanum atoms distributed at the interface may generate dipoles, and the dipoles may pull down a gate voltage, which is necessary to form a channel inversion layer of N-type in the active region 9a. Embodiments of the inventive concept may enable a threshold voltage of an NMOS transistor to be maintained, e.g., prevented from increasing, while a channel width thereof is decreased.

It is noted that in cases in which a semiconductor pattern is not provided between a gate pattern and an active region, a high-k dielectric layer may be in direct contact with a central top surface and an inclined edge surface of the active region. In such cases, the lanthanum atoms in a capping layer may further penetrate through an interface between the high-k dielectric layer and the inclined edge surface and be diffused into a bulk region of the first active region. Such a result may be obtained if the inclined edge surface has a (110) crystal surface rather than a (100) crystal structure. In such cases, any dipoles may be distributed at the interface between the high-k dielectric layer and the inclined edge surface, and may thereby increase a threshold voltage of an NMOS transistor.

This effect is of particular concern as channel widths of NMOS transistors are decreasing. More particularly, as a channel width of an NMOS transistor decreases, a ratio of an area of the inclined edge surface with respect to the central top surface, which may include a (100) crystal surface, may be increased. Thus, as the channel width of the NMOS transistor may decrease, the threshold voltage of the NMOS transistor may be further increased.

Furthermore, the capping layer may have poor step coverage. For example, the step coverage of the capping layer may be lower than one (1) when the capping layer is formed in a physical vapor deposition such as a sputtering technology. Thus, if a semiconductor pattern is not provided between a gate pattern and an active region, a thickness of the capping layer may be thinner on the inclined edge surface than on the central top surface. In such cases, lanthanum content is lower in the capping layer on the inclined edge surface than in the capping layer on the central top surface. As the result, the threshold voltage may be remarkably increased as a channel width of the NMOS transistor is decreased.

Embodiments of the inventive concept, however, may be advantageous over such cases by providing, e.g., the semiconductor pattern, e.g., 15a, 15b, over the active region, e.g., 9a, 9b, with the inclined edge surface 9e, and the semiconductor pattern, e.g., 15a, 15b, may include the flat top surface of a (100) crystal surface, and does not include any inclined edge surfaces of a (110) crystal surface. Therefore, embodiments of the inventive concept may enable a threshold voltage of an NMOS transistor to be maintained, e.g., prevented from increasing, while a channel width thereof is decreased.

Embodiments of the inventive concept may also be advantageous by reducing a threshold voltage of a PMOS transistor. More particularly, e.g., embodiments may provide the upper semiconductor pattern 15b2, which may include, e.g., a silicon-germanium layer, and may reduce a threshold voltage of a PMOS transistor. More particularly, because the band gap energy of mono crystalline silicon-germanium is lower than that of mono crystalline silicon, a gate voltage for generating a channel inversion layer may be decreased in proportion to the band gap energy of the channel region.

Figure 2B:
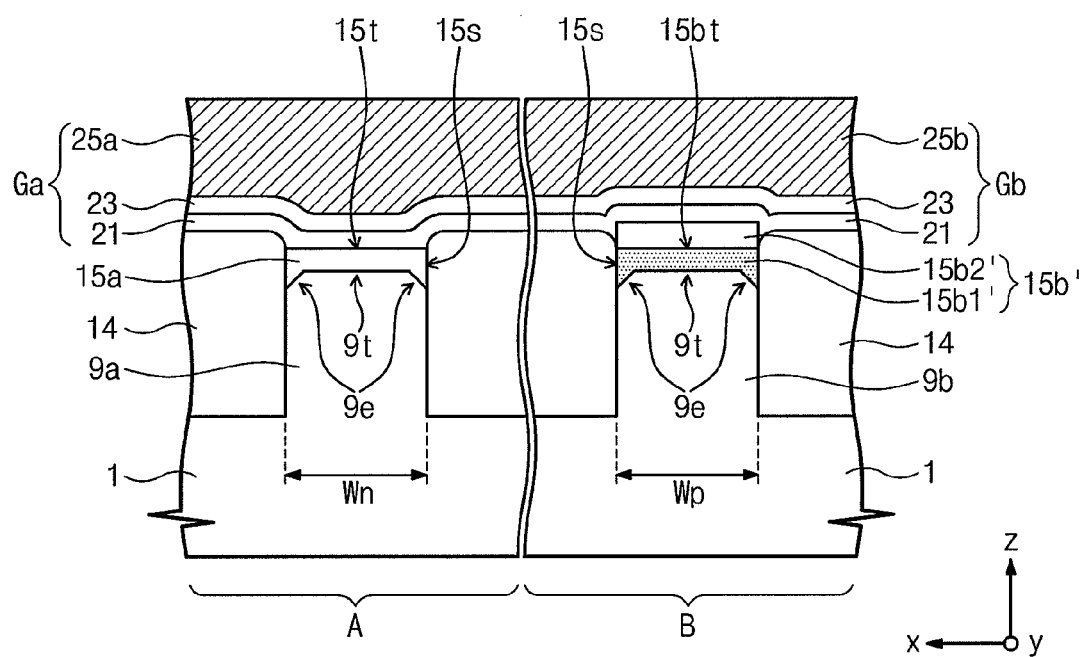
FIG. 2B illustrates a cross-sectional view of another exemplary embodiment of the semiconductor device of FIG. 1, taken along line I-I' of FIG. 1.

FIG. 2B illustrates a cross-sectional view of another exemplary embodiment of the semiconductor device of FIG. 1, taken along line I-I' of FIG. 1. In general, only differences between the exemplary embodiment of FIG. 2B and the exemplary embodiment of FIG. 2A will be described below. Referring to FIGS. 2A and 2B, it is noted that in the exemplary embodiment of FIG. 2B, orientation of a second semiconductor pattern 15b' is different from that of the second semiconductor pattern 15b of FIG. 2A.

Referring to FIGS. 1 and 2B, in the first active region A, the first semiconductor pattern 15a may be provided between the second active region 9b and the high-k dielectric layer 21, and in the second active region B, the second semiconductor pattern 15b' may be provided between the second active region 9b and the high-k dielectric layer 21. The second semiconductor pattern 15b' may include a lower semiconductor pattern 15b1' and an upper semiconductor pattern 15b2', which are sequentially stacked. More particularly, referring to FIGS. 2A and 2B, in the exemplary embodiment of FIG. 2B, the upper semiconductor pattern 15b2' may correspond to the first semiconductor pattern 15a in the first active region 9b and/or the lower semiconductor pattern 15b1 described above in regard to FIG. 2A, and the lower semiconductor pattern 15b1' may correspond to the upper semiconductor pattern 15b2 described above in regard to FIG. 2A.

More particularly, e.g., the lower semiconductor pattern 15b1' may include a material having band gap energy lower than that of the upper semiconductor pattern 15b2'. For example, the lower semiconductor pattern 15b1' may include a mono crystalline silicon-germanium pattern, and the upper semiconductor pattern 15b2' may include a mono crystalline silicon pattern like the first semiconductor pattern 15a.

The lower semiconductor pattern 15b1' of FIG. 2B may have a same profile shape as the first semiconductor pattern 15a of FIG. 2A and/or the lower semiconductor pattern 15b1 of FIG. 2A. The upper semiconductor pattern 15b2' of FIG. 2B may have a same profile shape as the upper semiconductor pattern 15b2 of FIG. 2A. That is, e.g., the lower semiconductor pattern 15b1' may include, as shown in FIG. 2B, a flat top surface 15bt of a (100) crystal surface that is parallel with the central top surface 9t of the second active region 9b and the sidewall 15s, which is substantially perpendicular to the flat top surface 9t. Therefore, the sidewall 15s of the lower semiconductor pattern 15b1' of FIG. 2B may also include a (100) crystal surface. More particularly, like the flat top surface 15t of the first semiconductor pattern 15a of FIG. 2A, the flat top surface 15bt of the lower semiconductor pattern 15b1' may not include any inclined surfaces. Further, in embodiments, while a top surface of the active regions 9a, 9b may include an inclined surface, e.g., 9e, the top surface 15t of the first semiconductor pattern 15a and/or the top surface 15bt of the lower semiconductor pattern 15b1', as well as a top surface of the upper semiconductor pattern 15b2' may not include any inclined surfaces.

In embodiments, the lower semiconductor pattern 15b1' may include a same profile shape as the first semiconductor pattern 15a. Thus, in such embodiments, the top surface 15bt of the lower semiconductor pattern 15b1' and the top surface 15t of the first semiconductor pattern 15a may include a (100) crystal surface which is parallel with the central top surface 9t of the respective active region 9b, 9a. The lower semiconductor pattern 15b1' may also include the sidewall 15s that may be substantially perpendicular to the flat top surface 15bt, as shown in FIG. 2B. Further, in such embodiments, the sidewalls 15s of the first conductive pattern 15a and the sidewalls 15s of the lower semiconductor pattern 15b1' may also include a (100) crystal surface.

In embodiments, the top surface 15t, 15bt of the first semiconductor pattern 15a and/or the lower semiconductor pattern 15b1, 15b1' and the sidewall 15s of the first semiconductor pattern 15t and/or the lower semiconductor pattern 15b1, 15b1' may not include any inclined surfaces.

An NMOS transistor according to the embodiment of the inventive concept may be substantially the same structure as the NMOS transistor of FIG. 2A. Thus, the NMOS transistor of this embodiment may have the same effect as the NMOS transistor of FIG. 2A.

A channel region of a PMOS transistor according to the exemplary embodiment of FIG. 2B may include a silicon-germanium pattern and a silicon pattern that are sequentially stacked. In the exemplary embodiment of FIG. 2B, while the silicon-germanium pattern may be disposed under the silicon pattern, the silicon-germanium pattern may contribute to reduce a threshold voltage of the PMOS transistor.

Exemplary methods of fabricating the semiconductor devices illustrated in FIGS. 1, 2a and 2b will be described below.

FIGS. 3, 4, 5, 6, and 7 illustrate cross-sectional views of resulting structures from stages in an exemplary method of fabricating the semiconductor device shown in FIG. 2A.

Figure 3:
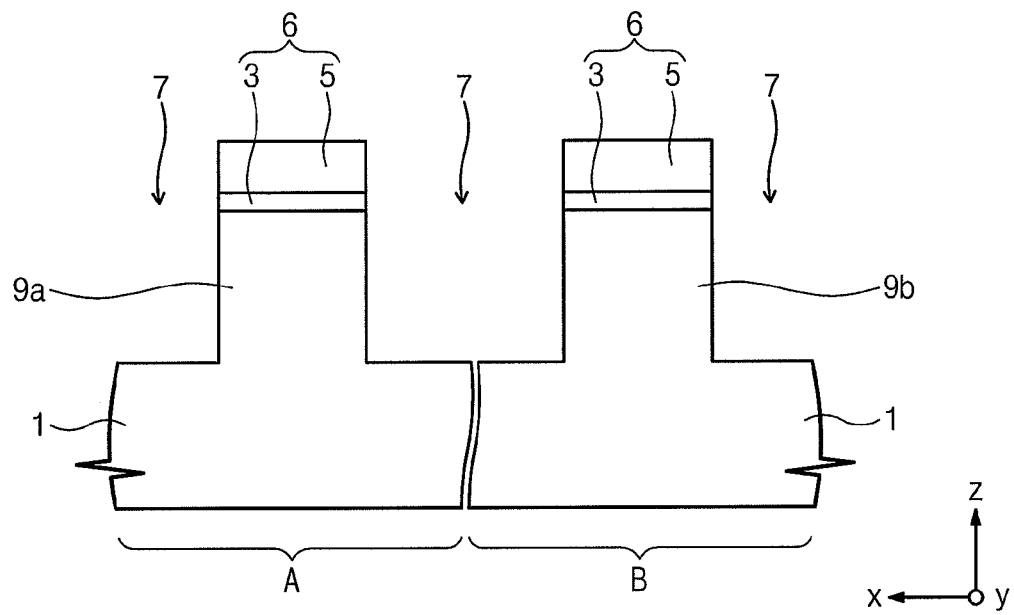
FIGS. 3, 4, 5, 6, and 7 illustrate cross-sectional views of resulting structures from stages in an exemplary method of fabricating the semiconductor device shown in FIG. 2A.

Referring to FIG. 3, hard mask patterns 6 may be formed on the semiconductor substrate 1 including the first active region A and the second active region B. The first active region A and the second active region B may be an NMOS transistor region and a PMOS transistor region, respectively. The semiconductor substrate 1 may include a mono crystalline silicon substrate having a main surface of a (100) crystal surface. Each of the hard mask patterns 6 may include a pad oxide pattern 3 and a pad nitride pattern 5 that are sequentially stacked.

The semiconductor substrate 1 may be etched using the hard mask pattern 6 as an etch mask to form a trench 7. The trench 7 may define the first and second active regions 9a and 9b in the first and the second regions A and B, respectively.

Figure 4:
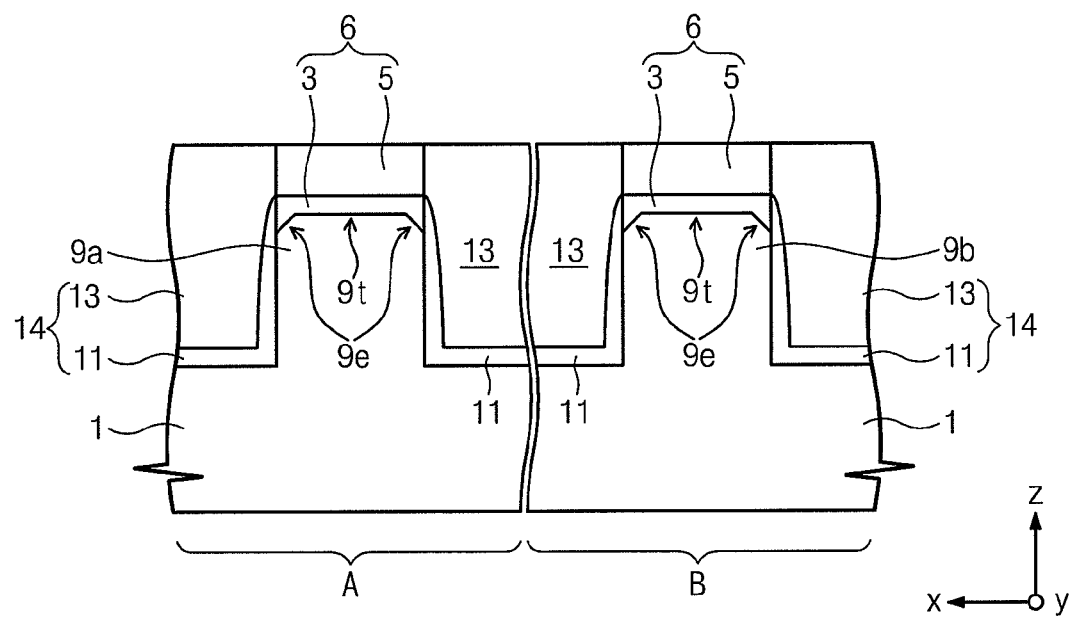

Referring to FIG. 4, the substrate including the trench 7 may be thermally oxidized to form a thermal oxide 11 on a sidewall and a bottom surface of the trench 7. The thermal oxide 11 may be formed to cure etch damage to the semiconductor substrate 1 during formation of the trench. Oxygen atoms may be provided into an interface between the pad oxide patterns 3 and the active regions 9a and 9b during the thermal oxidation process. Thereby, upper corners of the active regions 9a and 9b may be oxidized such that a bird's beak may be formed. Therefore, the upper corners of the active regions 9a and 9b may be transformed into inclined edge surfaces 9e. Each of the active regions 9a and 9b may include the central top surface 9t including a (100) crystal surface and the inclined edge surface 9e extending from the central top surface 9t.

An insulating layer may be formed on the entire surface of the substrate having the thermal oxide 11, and the insulating layer may be planarized to expose the hard mask patterns 6. As the result, an insulating pattern 13 may be formed in the trench 7, which may be surrounded by the thermal oxide 11. The thermal oxide 11 and the insulating pattern 13 may correspond to the device isolation layer 14. While the insulating layer is formed, the bird's beak may extend into the interface between the pad oxide patterns 3 and the active regions 9a and 9b. Therefore, the area of the inclined edge surfaces 9e may be increased, and the area of the central top surface 9t may be reduced.

If the central top surfaces 9t and perpendicular sidewalls of the active regions 9a and 9b include (100) crystal surfaces, the inclined edge surface 9e may be a flat surface with, e.g., an inclination of 45° with respect to the central top surfaces 9t, as shown, e.g., in FIG. 4. The inclined edge surface 9e may include a (110) crystal surface. In other words, when the active regions 9a and 9b are formed on a wafer which includes a main surface of a (100) crystal surface and a flat zone plane of a (100) crystal surface, and the sidewalls of the active regions 9a and 9b are parallel or perpendicular to the flat zone plane, the inclined edge surface 9e may include a (110) crystal surface.

In another embodiment, the inclined edge surface 9e may be formed to include a rounded profile shape. This inclined edge surface 9e may also include a (110) crystal surface in a part.

Figure 5:
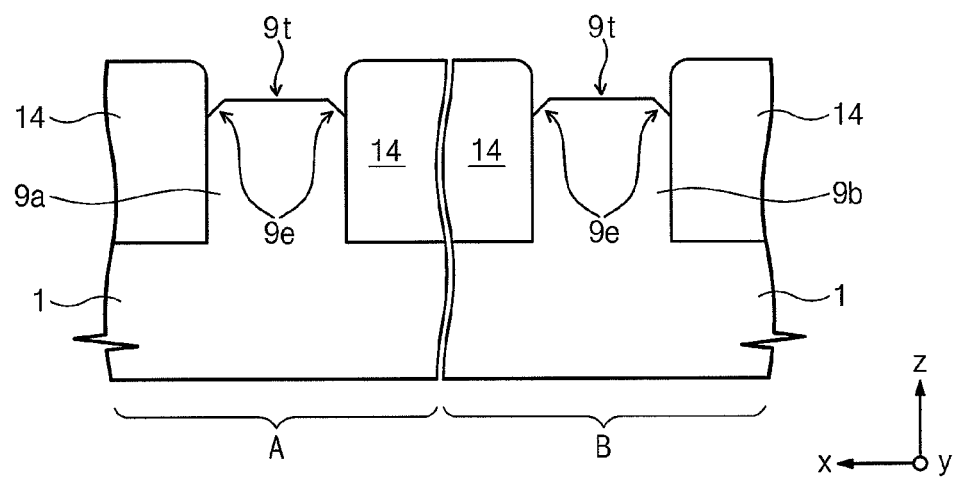
Figure 6:
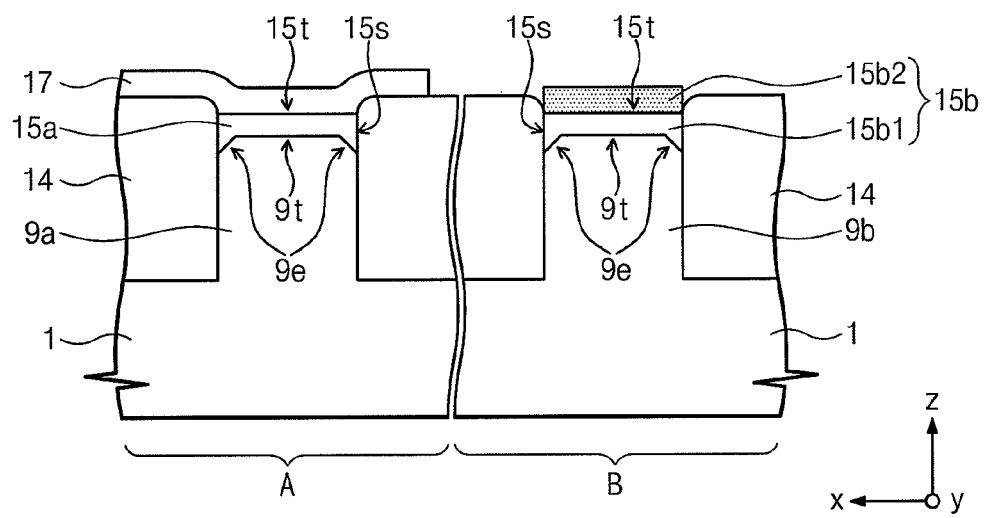

Referring to FIGS. 5 and 6, the hard mask patterns 6 may be removed to expose the central top surfaces 9t and the inclined edge surfaces 9e of the active regions 9a and 9b. Subsequently, the first semiconductor pattern 15a and the lower semiconductor pattern 15b1 may be formed on the first active region 9a and the second active region 9b, respectively. The first semiconductor pattern 5a and the lower semiconductor pattern 5b may be formed of silicon layers using selective epitaxial growth technology. Therefore, the first semiconductor pattern 15a and the lower semiconductor pattern 15b1 may include, e.g., mono crystalline silicon patterns.

When the first semiconductor pattern 15a and the lower semiconductor pattern 15b1 may be formed using the selective epitaxial growth technology, a growth rate of semiconductor patterns may be higher on the central top surfaces 9t of the (100) crystal surface than on the inclined edge surfaces 9e. Thus, the first semiconductor pattern 15a and the lower semiconductor pattern 15b1 may be formed, as shown in FIG. 6, to have flat top surfaces 15t that are parallel with the central top surfaces 9t and sidewalls 15s that are substantially perpendicular to the flat top surfaces 15t. As the result, the top surfaces 15t and 15bt and the sidewalls 15s of the first semiconductor pattern 15a and the lower semiconductor pattern 15b1 may be formed to include (100) crystal surfaces. The top surface 15t of the first semiconductor pattern 15a and/or the lower semiconductor pattern 15b1' and the sidewall 15s of the first semiconductor pattern 15t and/or the lower semiconductor pattern 15b1 may not include any inclined surfaces of, e.g., the (110) crystal surface.

A mask pattern 17 may be formed on the first region A. The mask pattern 17 may be formed to cover at least the first semiconductor pattern 15a. The mask pattern 17 may include an oxide layer. Subsequently, the upper semiconductor pattern 15b2 may be formed selectively on the lower semiconductor pattern 15b1. The upper semiconductor pattern 15b2 may be formed by, e.g., a selective epitaxial growth technology.

In embodiments, the upper semiconductor pattern 15b2 may be formed of a semiconductor layer having band gap energy lower than that of the lower semiconductor pattern 15b. For example, the upper semiconductor pattern 15b2 may be include a silicon-germanium layer if the lower semiconductor pattern includes a silicon layer. The lower semiconductor pattern 15b1 and the upper semiconductor pattern 15b2 may include a second semiconductor pattern.

Figure 7:
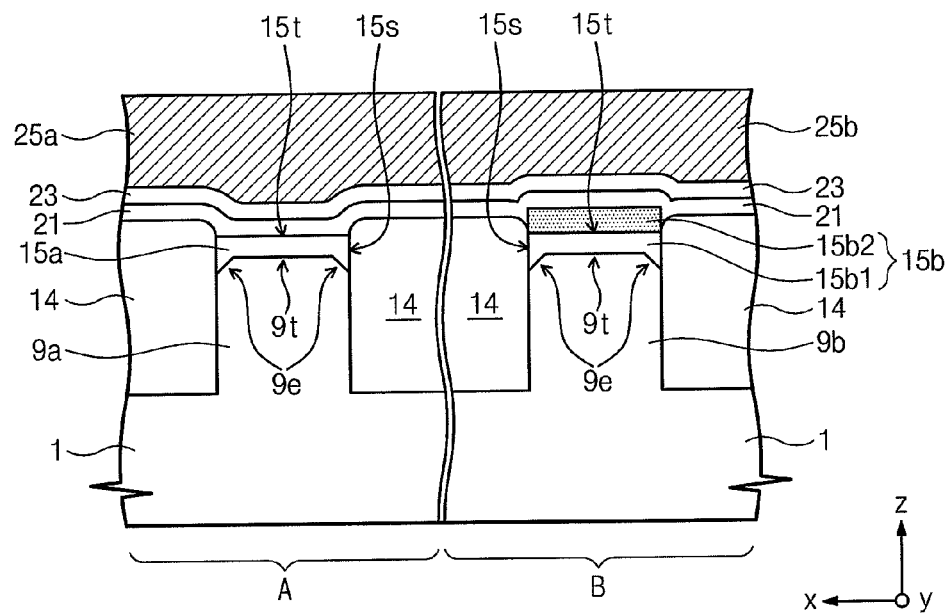

Referring to FIG. 7, the mask pattern 17 may be removed to expose the first semiconductor pattern 15a. Subsequently, a gate insulating layer may be formed on the entire substrate that includes the exposed first semiconductor pattern 15. The high-k dielectric layer 21 with a dielectric constant higher than that of silicon oxide and a capping layer 23 including lanthanum may be sequentially stacked to form the gate insulating layer. Alternatively, the gate insulating layer may be formed by sequentially stacking the capping layer 23 and the high-k dielectric layer 21. The capping layer 23 may include a lanthanum oxide layer.

A gate conductive layer may be formed on the gate insulating layer. The gate conductive layer and the gate insulating layer may be patterned to form the first gate pattern 15a and the second gate pattern 15b1 which may respectively cross over the first semiconductor pattern 15a and the upper semiconductor pattern 15b2. Therefore, the first gate pattern may include a first gate electrode 25a which crosses over the first active region 9a. The second gate pattern may include a second gate electrode 25b which crosses over the second active region 9b.

Impurities of N-conductivity type may be injected into the first active region using the first gate electrode 25a as an ion implantation mask to form the N-type source region SN of FIG. 1 and the N-type drain region DN of FIG. 1. Similarly, impurities of P-conductivity type may be injected into the second active region 9b using the second gate electrode 25b as an ion implantation mask to form the P-type source region SP of FIG. 1 and the P-type drain region DP of FIG. 1.

According to the above embodiments, lanthanum atoms may be diffused through the high-k dielectric layer and may be distributed at an interface between the first semiconductor pattern 15a and the high-k dielectric layer 21 without diffusing into a bulk region in the first semiconductor pattern 15a and the first active region 9a. This is because the top surface 15t of the first semiconductor pattern 15a has the (100) crystal surface without any (110) surfaces. As the result, the lanthanum atoms distributed at the interface between the first semiconductor pattern 15a and the high-k dielectric layer 21 may generate dipoles such that the dipoles may pull down threshold voltage of NMOS transistors. Such dipoles may not serve to pull down threshold voltage of PMOS transistors that may be formed on the second region B.

Further, the capping layer 23 may be formed to have excellent step coverage because the first semiconductor pattern 15a does not include any inclined surfaces. The capping layer 23 may be formed to have completely and/or substantially uniform lanthanum content in the entire semiconductor substrate. Therefore, a change, e.g., an increase, in the threshold voltage of the NMOS transistor may be reduced and/or prevented from increasing even if a channel width of the NMOS transistor is reduced.

The threshold voltage of the PMOS transistor may be decreased as a result of, e.g., the upper semiconductor pattern 15b2, that is, the silicon-germanium pattern. This is, as stated above, because the silicon-germanium may have lower band gap energy than the silicon.

Figure 8:
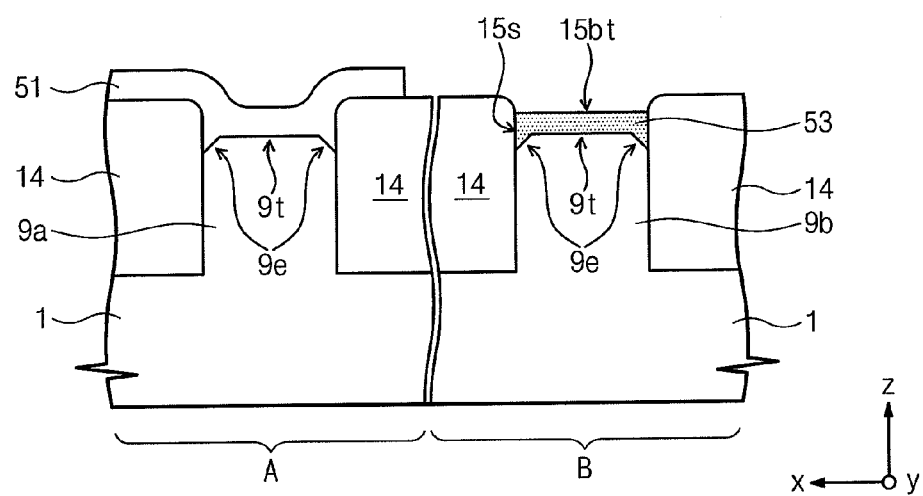
FIGS. 8 and 9 illustrate cross-sectional views of resulting structures from stages in an exemplary method of fabricating the semiconductor device shown in FIG. 2B.
Figure 9:
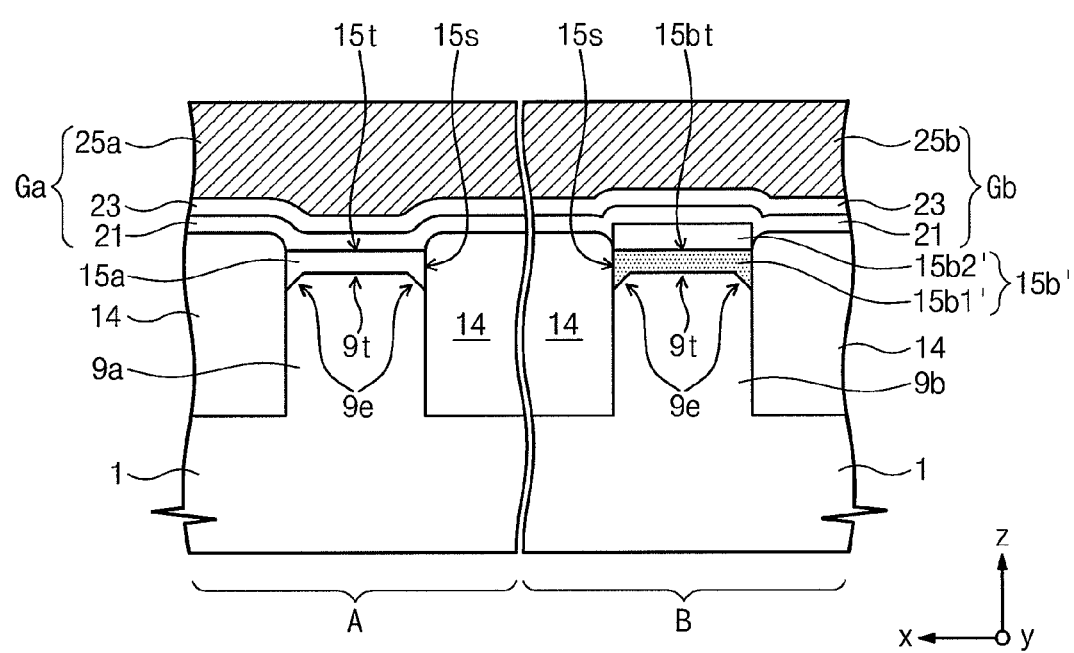

FIGS. 8 and 9 illustrate cross-sectional views of resulting structures from stages in an exemplary method of fabricating the semiconductor device shown in FIG. 2B. In general, only differences between the exemplary method of FIGS. 3 through 7 and the exemplary method of FIGS. 8 and 9 will be described below.

Referring to FIG. 8, a device isolation layer 14 and exposed active regions 9a and 9b may be formed by using the same methods as described with reference to FIGS. 3 through 5. A mask pattern 51 may be formed to cover the first active region 9a. A lower semiconductor pattern 15b1' may then be formed selectively on the second active region 9b. The lower semiconductor pattern 15b1' may be formed of a mono crystalline silicon-germanium layer by a selective epitaxial growth technology. Therefore, the lower semiconductor pattern 15b1' may also be formed to include a flat top surface 15bt including a (100) crystal surface and a sidewall 15s substantially perpendicular to the flat top surface 15bt.

Referring to FIG. 9, the mask pattern 51 may be removed to expose the first active region 9a. The first semiconductor pattern 15a and the upper semiconductor pattern 15b are selectively formed on the exposed first active region 9a and the lower semiconductor pattern 15b1', respectively. The first semiconductor pattern 15a and the upper semiconductor pattern 15b2' may include silicon layers formed, e.g., using a selective epitaxial growth technology. Thus, the first semiconductor pattern 15a may also be formed to include a flat top surface 15t a (100) crystal surface and a sidewall a (100) crystal surface substantially perpendicular to the flat top surface 15t. Therefore, the first semiconductor pattern 15a may be formed not to have any inclined surfaces of a (100) crystal surface. The lower semiconductor pattern 15b1' and the upper semiconductor pattern 15b2' may correspond to a second semiconductor pattern.

As described above, the upper semiconductor pattern 15b2' may include a silicon layer, and the lower semiconductor pattern 15b1' may include a silicon-germanium layer that has a lower band gap energy than that of the silicon layer. Therefore, the lower semiconductor pattern 15b1' may also contribute to pull down the threshold voltage of the PMOS transistor on the second region B.

According to embodiments of the inventive concept, a semiconductor pattern including a flat top surface of a (100) crystal surface may be disposed on an active region including a (100) crystal surface that includes an inclined edge surface with a plane orientation different from the (100) crystal surface, and a gate pattern may be disposed on the semiconductor pattern. Thus, the gate pattern may be in direct contact with the flat top surface of the (100) crystal surface of the semiconductor pattern without contacting the inclined edge surface. Thereby, the semiconductor device may be free from the instability of threshold voltage caused by the inclined edge surface.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A semiconductor device, comprising:
a device isolation layer arranged on a predetermined region of a semiconductor substrate to define an active region, the active region including a central top surface of a (100) crystal plane and an inclined edge surface extending from the central top surface to the device isolation layer;
a semiconductor pattern covering the central top surface and the inclined edge surface of the active region, the semiconductor pattern including a flat top surface of a (100) crystal plane parallel with the central top surface of the active region and a sidewall substantially and/or completely perpendicular to the flat top surface; and
a gate pattern overlapping the semiconductor pattern.

2. A semiconductor device as claimed in claim 1, wherein the semiconductor substrate includes a main surface of a (100) crystal plane.

3. A semiconductor device as claimed in claim 1, wherein a contact portion of the central top surface and the inclined edge surface is at a higher level than a contact portion of the inclined edge surface and the device isolation layer.

4. A semiconductor device as claimed in claim 1, wherein the inclined edge surface includes a (110) crystal plane.

5. A semiconductor device as claimed in claim 1, wherein the inclined edge surface includes a rounded profile shape.

6. A semiconductor device as claimed in claim 1, wherein the sidewall of the semiconductor pattern includes a (100) crystal plane.

7. A semiconductor device as claimed in claim 1, wherein the gate pattern includes a sequentially stacked gate insulating layer and a gate electrode.

8. A semiconductor device as claimed in claim 7, wherein the gate insulating layer includes lanthanum.

9. A semiconductor device as claimed in claim 1, wherein the active region, the gate pattern, and the semiconductor pattern are a first active region, a first gate pattern, and a first semiconductor pattern, respectively, and
the semiconductor device further includes:
a second active region adjacent to the first active region, the second active region defined by the device isolation layer;
a second semiconductor pattern including a lower semiconductor pattern and an upper semiconductor pattern that are sequentially stacked on the second active region, wherein the lower semiconductor pattern and the upper semiconductor pattern have different band gap energies; and a second gate pattern overlapping the upper semiconductor pattern.

10. A semiconductor device as claimed in claim 9, wherein one of the lower semiconductor pattern and the upper semiconductor pattern includes a silicon pattern that is the same as a silicon pattern of the first semiconductor pattern, and the other of the lower semiconductor pattern and the upper semiconductor pattern includes a silicon-germanium pattern.

11. A method for fabricating a semiconductor device, comprising:
   forming a device isolation layer on a predetermined region of a semiconductor substrate to define an active region, wherein the active region includes a central top surface of a (100) crystal plane and an inclined edge surface extending from the central top surface to the device isolation layer;
   forming a semiconductor pattern on the central top surface and the inclined edge surface of the active region, wherein the semiconductor pattern includes a flat top surface of a (100) crystal plane that is parallel with the central top surface of the active region and a sidewall which is substantially perpendicular to the flat top surface; and
   forming a gate pattern overlapping the semiconductor pattern.

12. A method as claimed in claim 11, wherein the inclined edge surface includes a (110) crystal plane.

13. A method as claimed in claim 11, wherein forming the semiconductor pattern includes performing a selective epitaxial growth technology so as to include a (100) crystal plane.

14. A method as claimed in claim 11, wherein the gate pattern further includes a sequentially stacked gate insulating layer and a gate electrode.

15. A method as claimed in claim 14, wherein the gate insulating layer includes lanthanum.

16. A method of fabricating a semiconductor device, comprising:
   forming a device isolation layer on a predetermined region of the semiconductor substrate to define a first active region and a second active region, wherein at least the first active region out of the first and second active regions includes a central top surface of a (100) crystal plane and an inclined edge surface extending from the central top surface to the device isolation layer;
   forming a first semiconductor pattern and a second semiconductor pattern respectively on the first and the second active regions, wherein the first semiconductor pattern includes a flat top surface of (100) crystal plane parallel with the central top surface of the first active region and a sidewall substantially perpendicular to the flat top surface of the first active region, and the second semiconductor pattern includes a lower semiconductor pattern having a first band gap energy and an upper semiconductor pattern having a second band gap energy that is different from the first band gap energy; and
   forming a first gate pattern and a second gate pattern overlapping the first and the second semiconductor patterns, respectively.

17. A method as claimed in claim 16, wherein the inclined edge surface includes a (110) crystal plane.

18. A method as claimed in claim 16, wherein forming the sidewall of the first semiconductor pattern includes using a selective epitaxial growth technology to include a (100) crystal plane.

19. A method as claimed in claim 16, wherein forming the first and second semiconductor patterns includes:
   selectively forming a first silicon pattern and a second silicon pattern on the first active region and the second active region, respectively;
   forming a mask pattern covering the first silicon pattern;
   selectively forming a silicon-germanium pattern on the second active region; and
   removing the mask pattern.

20. A method as claimed in claim 16, wherein forming the first and second semiconductor patterns includes:
   forming a mask pattern covering the first active region;
   selectively forming a silicon-germanium pattern on the second active region;
   removing the mask pattern; and
   forming a first silicon pattern and a second silicon pattern on the first active region and the silicon-germanium pattern, respectively.

* * * * *